United States Patent [19]

Strom et al.

[11] Patent Number: 4,908,346

[45] Date of Patent: Mar. 13, 1990

[54] CRYSTALLINE RARE EARTH ALKALINE EARTH COPPER OXIDE THICK FILM CIRCUIT ELEMENT WITH SUPERCONDUCTING ONSET TRANSITION TEMPERATURE IN EXCESS OF 77%

[75] Inventors: Lauri A. Strom; Edward Carnall, Jr.; Steven A. Ferranti, all of Rochester; Jose M. Mir, Webster, all of N.Y.

[73] Assignee: Eastman Kodak Company, Rochester, N.Y.

[21] Appl. No.: 68,391

[22] Filed: Jul. 1, 1987

[51] Int. Cl.$^4$ .................. H05K 1/00; H05K 1/16; B32B 3/00; B32B 7/02

[52] U.S. Cl. .................................. 505/1; 427/62; 427/63; 427/97; 174/125.1; 174/261; 428/209; 428/220; 428/334; 428/689; 428/901; 428/930

[58] Field of Search ............... 427/62, 63, 97, 226; 174/68.5, 125.1; 505/818; 428/928, 930, 209, 220, 334, 689, 901

[56] References Cited

U.S. PATENT DOCUMENTS

| | | | |
|---|---|---|---|
| 4,263,341 | 4/1981 | Martyniak | 427/97 |
| 4,316,785 | 2/1982 | Suzuki et al. | 427/63 |
| 4,323,593 | 4/1982 | Tsunashima | 427/97 |
| 4,329,016 | 5/1982 | Chen | 427/100 |
| 4,395,813 | 8/1983 | Roth et al. | 427/62 |
| 4,485,094 | 11/1984 | Pebler et al. | 427/226 |
| 4,605,471 | 8/1986 | Mitchell | 427/97 |
| 4,728,568 | 3/1988 | Sasada et al. | 427/97 |
| 4,732,780 | 3/1988 | Mitoff et al. | 427/97 |

OTHER PUBLICATIONS

Koinuma et al. "Preparation of $(La_{1-x}Sr_x)_2 CuO_{4-\delta}$ Superconducting films by Screen Printing method" Jpn. J. of Appl. phys 26 Apr. 1987, L399–401.
Koinuma et al. "High Tc superconductivity in Screen Printed Yb–Ba–Cu–O films", Jpn. J. of Appl. phys. vol. 26, No. 5, May, 1987, pp. L 761–762.
Meng et al, "High Tc superconducting thin films by chemical Spray Deposition" International J. of Modern Physics B. vol. 1, No. 2, p. 579 (1987).
Koch et al, "Thin films and squids made from YBa, Cuphd 3 Oy" MRS Extended Abastracts High Temperature Superconductors edited by Gubser et al, Apr. (1987), pp. 81–84.
Hammond et al, "Superconducting thin films of the Perovskite Superconductors by Electron–beam deposition" MRS edited by Gubser et al, Apr. 1987, pp. 169–171.
Cava et al, "Bulk Superconductivity at 91K in Single–phase Oxygen-deficient Perovskite $Ba_2YCu_3 Og_8$" Phys. Rev. Lett. vol. 58(16), Apr. 1987, pp. 1676–1679.
Business Week Apr. 6, 1987 "Our Life has changed" pp. 94–98.
Chemical & Engineering News, May 11, 1987 "Superconductivity: A revolution in Electricity is taking Shape" pp. 7–16.
Nature vol. 327, May 28, 1987, "IBM's Yorktown Heights Laboratory" p. 278.
Kawasaki et al, "Compositional and Structural Analyses for Optimizing the preparation Conditions of Superconducting $(La_{4-x}Sr_x)_yCuO_{4-\delta}$ Films by Sputtering" Jpn. J. of applied phys. vol. 26, No. 4, Apr. 1987, L 388–390.
Koinuma et al, "Some Problems in the Preparation of Superconducting Oxide Films on Ceramic Substrates" Jpn. J. of Applied Phys. vol. 26, No. 5, May 1987, pp. L 763–765.
J. G. Bednorz and K. A. Müller, "Possible High $T_c$ Superconductivity in the Ba–La–Cu–O System", Z. Phys. B.–Condensed Matter, vol. 64, pp. 189–193 (1986).

(List continued on next page.)

Primary Examiner—Norman Morgenstern
Assistant Examiner—Roy V. King
Attorney, Agent, or Firm—Carl O. Thomas

[57] ABSTRACT

Thick film circuit elements are disclosed comprised of an insulative substrate selected from the group consisting of strontium titanate, magnesia, alumina, and aluminum nitride, and providing a conductive path between at least two locations on the substrate, a crystalline rare earth alkaline earth copper oxide layer exhibiting a superconducting onset transition temperature in excess of 77° C. comprised on an $R_1A_2C_3$ crystalline phase.

16 Claims, 2 Drawing Sheets

OTHER PUBLICATIONS

C. W. Chu, P. H. Hor, R. L. Meng, L. Gao, Z. J. Huang, and Y. Q. Wang, "Evidence for Superconductivity above 40 K in the La–Ba–Cu–O Compound System", *Physical Review Letters*, vol. 53, No. 4, pp. 405–407, Jan. 1987.

C. W. Chu, P. H. Hor, R. L. Meng, L. Gao, and Z. J. Huang, "Superconductivity at 52.5 K in the Lanthanum–Barium–Copper–Oxide System", *Science Reports*, vol. 235, pp. 567–569, Jan. 1987.

R. J. Cava, R. B. vanDover, B. Batlog, and E. A. Rietman, "Bulk Superconductivity at 36K in $La_{1.8}Sr_{0.2}CuO_4$", *Physical, Review Letters*, vol. 58, No. 4, pp. 408–410, Jan. 1987.

J. M. Tarascon, L. H. Greene, W. R. McKinnon, G. W. Hull, and T. H. Geballe, "Superconductivity at 40K in the Oxygen-Defect Perovskites $La_{2-x}Sr_xCuO_{4-y}$", *Science Reports*, vol. 235, pp. 1373–1376, Mar. 13, 1987.

M. K. Wu, J. R. Ashburn, C. J. Torng, P. H. Hor, R. L. Meng, L. Gao, Z. J. Huang, Y. Q. Wang, and C. W. Chu, "Superconductivity at 93K in a New Mixed-Phase Y–Ba–Cu–O Compound System at Ambient Pressure", *Physical Review Letters, vol. 58, No. 9, pp. 908–910, Mar. 2, 1987.*

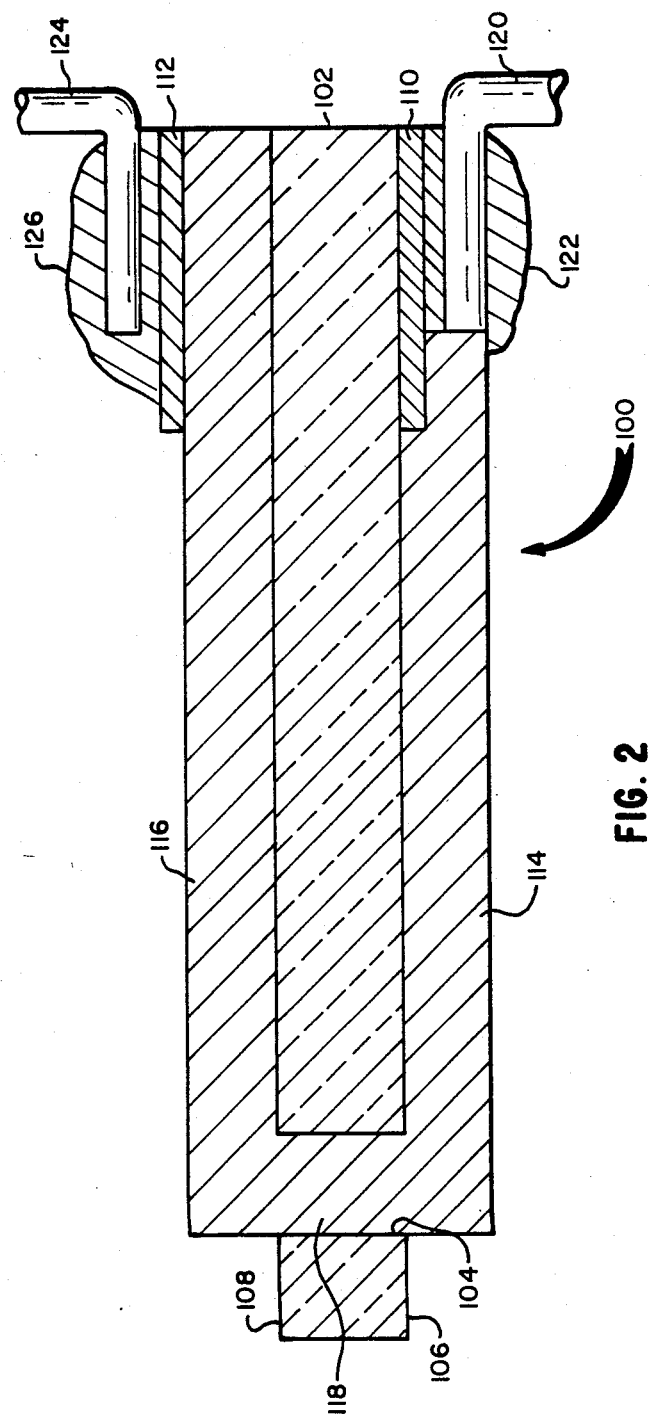

CRYSTALLINE RARE EARTH ALKALINE EARTH COPPER OXIDE THICK FILM CIRCUIT ELEMENT WITH SUPERCONDUCTING ONSET TRANSITION TEMPERATURE IN EXCESS OF 77%

FIELD OF THE INVENTION

The present invention relates to thick film electrical conductors and to processes for preparing either thick film or thin film electrical donucturs.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of fexhibiting superconductivity is cooled, a temperature is reached wat which resistivity decreases (conductivity increases) markedly as a function of further decrease in temperature. This is referred to as the superconducting transition temperature or, in the context of superconductivity investigations, simply as the critical temperature ($T_c$). $T_c$ provides a conveniently identified and generally accepted reference point for marking the onset of superconductivity and providing temperature randkings of superconductivity in differing materials.

It has been recently recognized that certain rare earth alkaline earth copper oxides exhibit superconducting transition temperatures well in excess of the highest previously known metal oxide $T_c$, a 13.7° K. for the metal $Nb_3Ge$.

Recent discoveries of higher superconducting transition temperatures in rare earthf alkaline earth copper oxides are reported in the following publications:

P-1 J. G. Bednorz and K. A. Müller, "Possible High $T_c$ Superconductivity in the Ba-La-Cu-O System", *Z. Phys. B.—Condensed Matter*, Vol. 64, pp. 189–193 (1986) revealed that polycrystalline compositions of the formula $Ba_xLa_{5-x}Cu_5O_{5(3-y)}$, where x=1 and 0.75 and Y>O exhibited superconducting transition temperatures in the 30° K. range.

-2 C. W. Chum, P. H. Hor, R. L. Meng, L. Gao, Z. J. Huang, and Y. Q. Wang, "Evidence for Superconductivity above 40° K. in the La-Ba-Cu-O Compound System", *Physical Review Letters*, Vol. 53, No. 4, pp. 405–407, Jan. 1987, reported increasing $T_c$ to 40.2° K. at a pressure of 13 kbar. At the end of this article it is stated that M. K. Wu increased $T_c$ to 42° K. at ambient pressure by replacing Ba with Sr.

P-3 C. W. Chu, P. H. Hor, R. L. Meng, L. Gao, and Z. J. Haung, "Superconductivity at 52.5° K in the Lanthanum-Barium-Copper-Oxide System", *Science Reports*, Vol. 235, pp. 567–569, Jan. 1987, a $T_c$ of 52.5° K. for $(La_{0.9}Ba_{0.1})_2CuO_{4-7}$ at high pressures.

P-4 R. J. Cava, R. B. vanDover, B. Batlong, and E. A. Rietman, "Bulk Superconductivity at 36° K. in $La_{1.8}Sr_{0.2}CuO_4$", *Physical Review Letters*, Vol. 58, No. 4, pp. 408–410, Jan. 1987, reported resistivity and magnetic susceptibility measurements in $La_{2-x}Sr_xCuO_4$, with a $T_c$ at 36.2° K. when x=0.2.

P-5 J. M. Tarascon, L. H. Green,e W. R. Mckinnon, G. W. Hull, and T. H. Geballe, "Superconductivity at 40° k. in the Oxygen-Defect Perovskites $La_{2-x}Sr_xCuO_{4-y}$", *Science Reports*, Vol. 235, pp. 1373–1376, Mar. 13, 1987, reported title compounds ($0.05 \leq X \leq 1.1$) with a mxaimum $T_c$ of 39.3° K.

P-6 M. K. Wu, J. R. Ashburn, C. J. Torng, P. H. Hor, R. L. Meng, L. Gao, Z. J. Hunang, Y. Q. Wang, and C. W. Chu, "Superconductivity at 93° K. in a New Mixed-Phase Y-Ba-Cu-O Compound System at Ambient Pressure", *Physical Review Letters*, Vol. 58, No. 9, 908–910, Mar. 2, 1987, reported stable and reproducible superconducting transition temperatures between 80° and 93° K. at ambient pressures for materials generically represented by the formula $(l_{1-x}M_x)_aA_bDy$, where L=Y, M=Ba, A=Cu, D=O, x=0.4, a=2, b=1, and y≦4.

The experimental details provided in publications P-1 through P-6 indicate that the rare earth alkaline earth copper oxides prepared and investigated were in the form of cylindrical pellets produced by forming an intermediate oxide by firing, grinding or otherwise pulverizing the intermediate oxide, compressing the particulate intermediate oxide formed into cylindrical pellets, and then sintering to produce a polycrystalline pellet. While cylindrical pellets are convenient articles for cooling and applying resistance measuring elecrodes, both the pellets and their preparation prcedure offer significant disadvantages to producing useful electrically conductive articles, particularly articles whichy exhibit high conductivity below ambient temperature—e.g., superconducting articles. First, the step of grinding or pulverizing the intermediate oxide on a commercial scale prior to sintering is both time and energy consuming and inherently susceptible to material degradation due to physical stress on the material itself, erosion of grinding machinery metal, and handling. Second, electrically conductive articles rarely take the form of pellets. Electrically conductive articles commonly include either thin or thick films forming conductive pathways on substrates, such as insulative and semiconductive substrates—e.g., printed and integrated circuits.

CROSS-REFERENCE TO RELATED FILING

Mir, Agostinelli, Peterson, Paz-Pujalt, Higberg, and Rajeswaran U.S. Ser. No. 046,593, filed May 4, 1-87, titled Metalorganic Deposition Process for Preparing Superconducting Oxide Films, commonly assigned, discloses articles in which an electrically conductive layer on a substrate exhibits a superconducting transition temperature in excess of 30° K. Conductive layers are disclosed comprised of a crystalline rare earth alkaline earth copper oxide. Processes of preparing these articles are disclosed in which a mixed metal oxide precursor is coated in solution and subsequently heated to its thermal decomposition temperature to create an amorphous mixed metal oxide layer. The amorphous layer is then heated to its crystallization temperature. Thin conductive films are formed in a single iteration of the process.

SUMMARY OF THE INVENTION

In one aspect this invention is directed to a process of forming an electrical conductor on an insulative substrate comprising coating a conductor precursor on the insulative substrate and converting the conductor precursor to an electrical conductor.

The process is characterized by the steps of (i) coating the conductor precursor in the form of particles metal-ligand compounds of each of rare earth, alkaline earth, and copper containing at least one thermally volatilizable ligand, (ii) heating the coated conductor precursor in the presence of oxygen to form an intermediate coating on the substrate, and (iii) converting the intermediate coating to a crystalline electrical conductor.

In another aspect this invention is directed to a circuit element comprising an insulative substrate and means for providing a conductive path including a thick film conductor between at least two locations on the substrate. The circuit element is characterized in that the thick film is comprised of a crystalline rare earth alkaline earth copper oxide. layer having a thickness of at least 5 μm.

The present invention makes available to the art a process capable of producing on a substrate either thin films or thick films containing an electrically conductive rare earth alkaline earth copper oxide.

The term "thin film" is employed to indicate films having thicknesses of less than 5 μm, such films most typically having thicknesses of less than 1 μm.

The term "thick film" is employed in its art recognized usage to indicate films having thicknesses in excess of 5 μm.

The process of the present invention offers the distinct advantage of being capable of producing electrically conductive thick films in a single iteration of the process. That is, sequential iterations of coating conductor precursors and converting these precursors to an electrically conductive form are not required to arrive at thick film dimensions. Additionally, it is quite surprising and advantageous that electrically conductive films, praticularly thick films, can be produced by the present invention, since rare earth alkaline earth copper oxides are known to require heating to relatively high temperatures to produce the crystalline phase responsible for electrical conduction. As is generally recognized, the thicker a coating, the larger the mechanical stresses which it must withstand during its formation. Processes which readily produce defect free thin films quite often produce thick films that are riddled with stress fractures, often accompanied by peeling from the substrate on which they are formed. Such defects, of course, render films unsuitable for use as electrical conductors. The present invention provides articles containing electrically conductive films, including thick films, that are capable of low resistance electrical conduction.

In certain preferred forms of the invention the articles produced exhibit high superconducting transition temperatures, where the term "high superconducting transition temperature" is herein defined as a superconducting transition temperature in excess of 30° K. In certain advantageous forms the articles produced by this invention exhibit superconducting transition temperatures and, optimally, true superconductivity, at temperatures in excess of 77° K., the temperature of liquid nitrogen.

The thick film articles of this invention are believed to be the first high superconducting transition temperature thick film articles. This invention further provides the first thick film articles exhibiting superconductivity at temperatures in excess of 77° K.

The process of the present invention is particularly well suited to the fabrication of electrical circuit components. It is compatible with the formation of patterned electrical conductors. It is capable of producing thick films of desirable electrical conduction properties, including supersonducting properties, on a variety of substrates. The process of the invention is further capable of producing films with limited substrate interaction.

The articles of this invention can be fabricated by techniques that avoid the disadvantages of the prior art. No grinding or pulverizing steps are required. In addition, the electrically conductive films can be formed on the substrates with minimal heating of their supporting substrates. Further, the conductive films are compatible with solders, bonding pads, and other commonly employed electrical conduction path connectors.

BRIEF DESCRIPTION OF THE DRAWINGS

These and other advantages of the invention can be better appreciated by reference to the following detailed description of preferred embodiments considered in conjunction with the drawings, in which FIG. 1 is a schematic diagram showing process steps and articles produced thereby and FIG. 2 is a cross-sectional view of an electric circuit component.

DESCRIPTION OF PREFERRED EMBOIDMENTS

Figure 1:
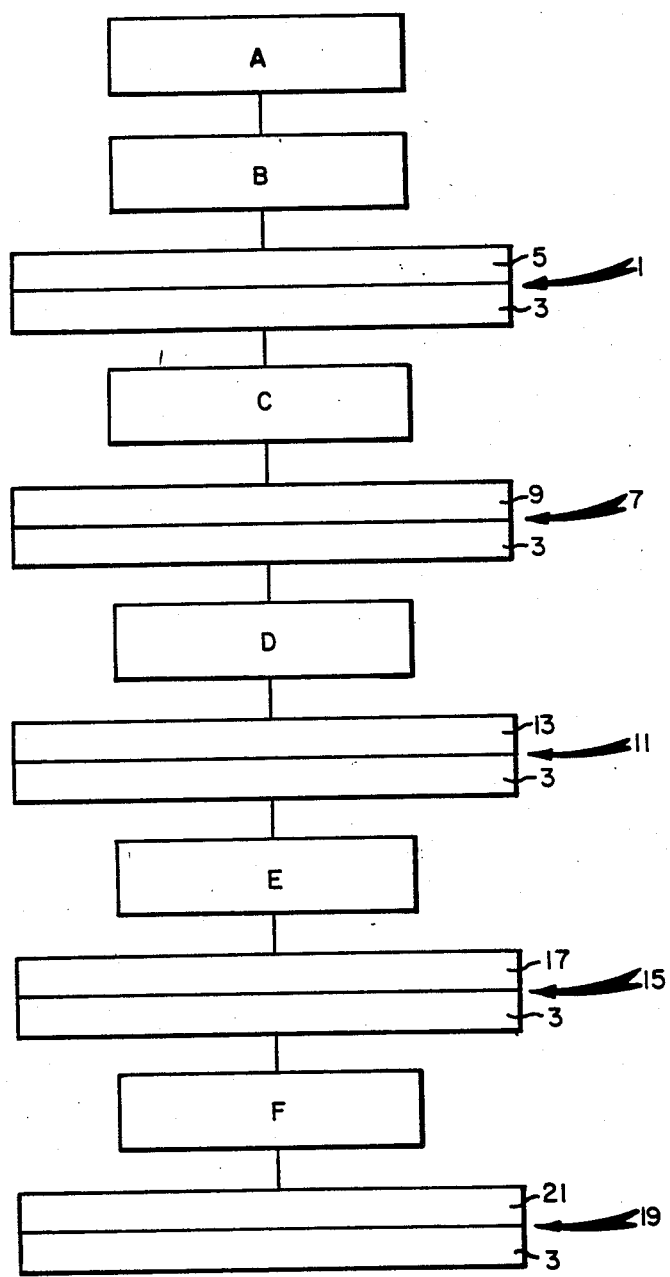

The present invention has as its purpose to make available electrically conductive articles exhibiting a rare earth alkaline earth copper oxide conductive layer coated on a substrate. The term "rare earth alkaline earth copper oxide" refers to a composition of matter containing at least one rare earth element, at least one alkaline earth element, copper, and oxygen. The term "rare earth" is employed to designate yttrium and lanthanides—i.e., elements of the lanthanide series. Lanthanum, samarium, europium, gadolinium, dysprosium, holmium, erbium, and ytterbium are particularly preferred lanthanides. The term "alkaline earth" indicates elements of Group 2 of the Periodic Table of elements as adopted by the American Chemical Society. Calcium, strontium and barium are preferred alkaline earth elements for the practice of this invention.

In keeping with the established practice in the ceramics aret of shortening lengthy chemical names of mixed metal oxides by substituting acronyms based on the first letters of the metals present, the term "RAC" is hereinafter employed to indicate generically rere earth alkaline earth copper oxides. When it is intended to designate specifically a lanthanide or yttrium as the rare earth component, L or Y, respectively, is substituted for R; and when it is intended to designate specifically strontium or barium as the alkaline earth component, S or B, respectively, is substituted for A.

Except as otherwise noted, all steps in the preparation of electrically conductive articles according to this invention are understood to be practicable in air at atmospheric pressure. It is, of course, recognized that increasing the proportion of ambient oxygen present and operation at elevated pressures, used separately or together, is generally compatible with the practice of this invention and can be employed, although not requried.

The present invention can be appreciated by the schematic diagram shown in FIG. 1. In Step A a composition containing particles of metal-ligand compounds is obtained. Each particle contains rare earth, alkaline earth, and copper atoms in the same ratio desired in the final RAC containing conductive layer. Furhter, the atoms are intimately intermixed so that the compositon of each particle is preferably essentially uniform. Associated with the metal atoms and completing the compounds are volatilizable ligands, which can be all alike or chosen from among different ligands.

The particles can be of any size convenient for coating. The particles can exhibit a mean diameter up to the thickness of the coating to be formed, but more uniform films are realized when the mean particle diameters are relatively small in relation to the thickness of the film to be formed. The particles are preferably less than about 2 $\mu$m in mean diameter, optimally less than 1 $\mu$m in mean diameter. The minimum mean diameter of the particles is limited only by synthetic convenience.

A preferred technique of this invention for producing metal-ligand compound particles is to dissolve the rare earth, alkaline earth, and copper metal ligand compounds in a mutual solvent and then to spray the solution through an atomizing nozzle into a gaseous atmosphere. The solvent is chosen to be evaporative in the gaseous atmosphere. Thus, the individual particles are dispersed in the gaseous atmosphere as liquid particles and eventually come to rest at a collection site as either entirely solid particles or particles in which the proportion of solvent has been sufficiently reduced that each of the metal-ligand compounds present has precipitated to a solid form. In the latter instance* the particles by reason of the residual solvent, now no longer acting as a solvent, but only as a continuous dispersing phase, form a paste. The paste constitutes a highly convenient coating vehicle. When the particles are collected in a friable form with all or substantially all of the initially present solvent removed, it is recognized that a paste can still be formed, if desired, by adding to the particles a small amount of a liquid to promote particle cohesion—i.e., to constitute a paste.

Only a very small amount of liquid is required to promote particle cohesion and thereby form a paste. Typically the liquid constitutes less than 20 percent of the total composition weight and preferably less 15 percent of the total composition weight. While optimum paste consistencies can vary depending upon the selection of processes for coating the paste, it is generally contemplated that the paste viscosity will be in the range of from $5 \times 10^4$ to $3 \times 10^6$ centripoise, preferably from $1 \times 10^5$ to $2.5 \times 10^6$ centipoise.

While atomization and drying can be undertaken in air at room temperatures, it is recognized that any gaseous medium which does not detrimentally react with the metal-ligand compounds can be employed. Further, the temperature of the liquid forming the particles or, preferably, the gaseous medium can be increased to accelerate the solvent evaporation rate, provided only that such elevated temperatures in all instance be maintained below the thermal decomposition temperatures of the metal-ligand compounds.

The advantage of solidifying the metal-ligand compounds while they are trapped within discrete particles is that bulk separations of the rare earth, alkaline earth, and copper are prevented. The particle preparation approach offers distinct advantages over simply evaporating bulk solutions to dryness in that each particle produced by the process of this invention contains the desired ratio of rare earth, alkaline earth, and copper elements. This produces a solid particle coating compositon of microscale uniformity.

In Step B of the preparation process, onto a substrate are coated the metal-ligand compound particles, preferabhly combined with a carrier liquid to form a coatable paste or slurry. The resulting coated article 1 as schematically shown consists of substrate 3 and a layer 5 formed by RAC precursors (metal-ligand compounds) and film forming solvent. Although the layer 5 si shown coextensive with the substrate 3, it is appreciated that the particles are well suited, particularly when coated in the form of a paste or slurry, to being laid down in any desired pattern on the substrate. The paste can, for example, be deposited by any of a variety of conventinal image defining coating techniques, such as screen or gravure printing. Since thick conductive films are most commonly formed in the art by screen printing, the present invention is highly compatible with conventional printed circuit preparations processes.

In Step C article 1 is heated to a temperature sufficient to volatilize at least a portion of the ligands and the film forming solvent. The element 7 resulting consists of substrate 3 and intermediate layer 9. In its intermediate form the coating exhibits relatively low levels of electrical conductivity. The exact form of the intermediate coating depends upon the specific choice of ligands and the thermal profile employed in its formation. The intermediate coating in some instances contains relatively stable ligands—e.g., carbon in the form of carbonates. The intermediate coating can range from amorphos to mixtures of crystalline and amorphous phases to mixtures of crystalline phases.

In Step D the article 7 is heated to a temperature sufficient to convert the intermediate layer to a more electrically conductive crystalline form. Heating is relied upon both to disspell ligands other than oxygen and to supply the activation energy required for the desired crystalline reordering of the atoms forming the coating to occur. Crystalline reordering involves nucleation of the desired electrically conductive crystalline phase followed by crystal growth. Nuclei of the desired crystalline phase are believed to be initially formed in Step C while growth of the desired electrically conductive crystalline phase is clearly observed in Step D.

According to accepted percolation theory, for a layer consisting of conducting spheres located in a surrounding nonconducting medium the spheres must account for at least 45 percent by volume of the layer for satisfactory electrical conductivity to be realized. If conducting particles of other geometric forms, particularly elongated forms, are substituted for the spheres, the conducting particles can account for less of the layer volume while still realizing satisfactory layer elect rical conductivity. Similarly, electrical conductivity can be realized with a lesser proportion of conducting particles when the surrounding medium is also conductive. Thus, all layers containing at least 45 percent by volume electrically conductive particles are by accepted theory electrically conductive. Although satisfactory electrical conductivity can be realized with a lesser volume of the crystalline phase, it is generally contemplated that in the electrically conductive RAC layer the crystalline phase will account for at least 45 percent by volume and preferably 70 percent by volume of the total RAC layer. Higher proportions of crystalline phase in the electrically conductive RAC layer are contemplated, including RAC layers containing at least 90 percent and, in some instances, greater than 99 percent of the desired electrically conductive crystalline phase.

Heating to any convenient temperatures level can be employed to achieve crystallizatin the RAC layer. To avoid interaction with less than inert substrates, it is generally preferred that heating of the RAC layer be heated no higher than is required for satisfactory crystallization. Heating to achieve crystallization can, for example, be limited to temperatures below the melting point of the RAC composition forming the layer. Extended heating temperatures or times beyond those producing crystallization can result in rounding of crystal corners and edges, thereby reducing the area of contact between adjacent crystal facets and restricting the conduction path through the crystalline RAC layer. From microscopic examination of RAC layers optimum heating times can be selected for maximizing both the proporiton of the RAC layer accounted for by the crystalline phase and the desired fconfiguration of the crystals produced, thereby maximizing electrical conductivity.

Step E entails controlled cooling of the RAC layer from its crystallization temperature. By slowing the rate of cooling of the crystalline RAC layer imperfections in the crystal lattices can be reduced and electrical conductivity, which is favored with increasing order in the crystal struture, is increased. Cooling rates of 25° C. per minute or less are comtemplated until the crystalline RAC layer reaches a temperature of at least 500° C. or, preferably, 200° C. Below these temperatures the lattice is sufficiently rigid that the desired crystal structure is well established. The article 15 produced is formed of the annealed crystalline RAC layer 17 on substrate 3.

While the article 15 exhibits high levels of electrical conductivity, in some instances further heating of the article 15 in an oxygen enriched atmosphere has been observed to increase electrical conductivity. In addition to oxygen supplied from the ligands the oxygen forming the crystalline RAC layer is obtained from the ambient atmosphere, typically air. It is believed that in some instances, depending upon the crystal structure being produced, ambient air does not provide the proportion of oxygen needed to satisfy entirely the available crystal lattice sites.

Therefore, optional Step F entails heating the article 15 in an oxygen enriched atmosphere, preferably pure oxygen. the object is to equilibrate the RAC crystalline layer with the oxygen enriched atmosphere, thereby increasing the proportion of oxygen in the crystal lattice structure. Temperatures for oxygen enrichment of the crystalloine RAC layer are above the minimum annealing temperatures employed in Step E described above. To be effective in introducing oxygen into the crystal lattice temperatures above those at which the lattice becomes rigid are necessary. The duration and temperature of heating are interrelated, with higher temperatures allowing shorter oxygen enrichment times to be employed. Substantially complete oxygen equilibration can be realized at near minimum temperatures in about 1 hours. Maximum oxygen enrichment has been found to occur in the temperature range of from 450° to 500° C.

In preparing RAC layers shown to be benefitted by oxygen enrichment of the ambient atmosphere Step F can be consolidated with either or both of Steps D and E. Oxygen enrichment is particularly compatible with Step E, allowing annealing out of crystal lattice defects and correction of crystal lattice oxygen deficiencies to proceed concurrently. Since each of Steps C, D, E, and F involve heating, it is appreciated that in most instances these steps can be most conveniently practiced as part of a continuous heating profile, one step flowing smoothly into the next.

The final electrically conductive article 19 is comprised of a crystalline, electrically conductive RAC layer 21 on substrate 3. Depending upon specific choices of materials and preparation techniques, the article 19 can exhibit a high superconducting transition temperature.

The term "high superconducting transition temperature" is herein defined as a $T_c$ of greater than 30° K.

The process described for preparing electrically conductive articles having RAC layers offers several distinct advantages. One of the most significant advantages is that the proportions of rare earth, alkaline earth, and copper elements in the final RAC layer 21 exactly corespond to those present in the RAC precursor layer 5. In other words, the final proportion of rare earth, alkaline earth, and copper elements is detemined merely by the desired proportions in the metal-ligand compound particles employed as starting materials. This avoids what can be tedious and extended trial and error adjustments of proportions required by commonly employed metal oxide depositon techniques, such as sputtering and vacuum vapor deposition. Further, the present process does not require any reduction of atmospheric pressures, and thus no equipment for producing either high or low vacuum.

A particular advantage of the present process is that it readily lends itself to the formation of electrical conductor patterns on limited portions of substantially planar substrate surfaces. Thus, the present process is readily applied to the fabrication of printed and hybrid circuits. Patterning can be readily achieved by coating the layer 5 of article 1 in the desired pattern, as described above. As an adjunct or alternative to metal-ligand compound coating patterning any one of the RAC layers 9, 13, 17, or 21 of articles 7, 11, 15, or 19 can be patterned by conventional photoresist pattern definition and etching of the RAC layer.

Although the foregoing process has been described in terms of extremely simple articles in which the RAC layer is formed entirely on a insulative substrate, it is appreciated that in many practical applications only a portion of the RAC layer will be formed directly on a surface of the substrate. For example, in fabricating electrical circuit components it is common practice to first coat metal pads (conductive areas) on an insulative substrate for the purpose of facilitating external lead (pin) connections. The RAC layer or several portions of the RAC layer can be formed on the insulative substrate to provide a conduction path or paths between spaced pads or other conductive regions previously formed on the substrate. Any conductive material can be precoated on the substrate which is capable of withstanding the temperatures requried to form the RAC layer. For example, gold pads are commonly used in electrical circuit component fabrication and are entirely compatible with fabricating RAC layers as required by this invention. Electrical connection to the surface of a thick film which has already been coated on the substrate and fired to produce the electrically conductive RAC phase is also possible. Metal pads (e.g., indium) can be made to adhere to the crystalline RAC surface at relative low temperatures (<200° C.). Subsequent elecrical connection to the overlying metal pad can be made using conventional bonding techniques—e.g., soldering techniques, such as with a lead tin solder. For example, copper wire can be soldered to the overlying pad to complete the desired electrical conduction path.

FIG. 2 illustrates a cross-section of an electrical circuit component 100 according to this invention. An insulative substrate 102 is provided having an aperture 104 extending between first and second major surfaces 106 and 108 of the substrate. Metal pad 110 is located on the first major surface of the substrate. Thick film RAC layers 114 and 116 are located on the first and second major surfaces of the substrate. The RAC layer 114 in part overlies the metal pad 110. A portion 118 of the composition forming the RAC layers extends into the aperture 104 connecting the RAC layers on opposite surfaces of the substrate. A metal lead 120 is bonded to the first RAC layer and the metal land 110 by solder 122. A second metal lead 124 is connected to the second RAC layer through interposed metal pad 112 by solder 126. Instead of being soldered the leads can alternatively be bonded by any other convenient conventional means, such as ultrasonic wire bonding or thermal compression bonding.

Although for simplicity in FIG. 2 the RAC layers are shown as forming linear conduction paths, they can independently form any conduction path configuration found in conventional circuits. For example, the conduction path can be serpentine or sinuous. It can be spiral, as in planar motor or generator windings. Further, instead of itself providing the entire conduction path between the leads 120 and 124, the RAC layers can form a conduction path in series and/or in parallel with conventional electrical circuit components, such as resistors, capacitors, transistors, diodes, integrated circuit elements, and the like.

The substrate is referred to a s insulative, only because it is insulative in comparison to the conduction properties of the RAC layer. As herein employed the term "insulative subst rate" refers to any substrate having an electrical resistance of sufficiently greater magnitude than that of the RAC layer that current flow occurs predominantly through the RAC layer rather than the substrate on which it is formed.

While ideal substrates are those which remain chemically nonrective during fabrication of the crystalline RAC layer, in practice when RAC crystallization temperatures are encountered by the substrate at least some interaction of the RAC layer occurs with all but the most stable of substrates. In some instances less than hoped for levels of electrical conductivity have been observed in fabricating RAC thin films, believed to be attributable to interaction of the crystallized RAC layer with its substrate at their mutual interface. Unwanted reductions in $T_c$ and zero resistivity temperatures are believed to be unwanted manifestations of substrate interaction with the crystalline RAC layer. Performing multiple iterations of the intermediate RAC layer, particularly where the first intermediate RAC layer forms a thin film, can be used to control substrate interaction with the thin film.

It has been observed that the thick films produced by the present process exhibit higher $T_c$ and superconducting properties with a wider variety of substrates than has been observed in producing thin films. In this instance the portion of the crystalline RAC layer adjacent the substrate is acting as a barrier protecting the portion of the RAC layer remote from the substrate.

An alternative is to interpose between the substrate and the crystalline RAC layer a barrier of a different compositon. The interposed barrier layer can itself take the form of a crystalline RAC layer, differing in the specific RAC composition chosen. In this instance the barrier layer can be viewed as a second crystalline RAC layer, which can, if desired, perform electrical conduction as well as acting as a barrier. In other instances the barrier can be viewed as an extension of the substrate.

For example, a ceramic substrate coated with a thin refractory metal layer or a semiconductor substrate coated with an oxide or nitride, each of which are in turn overcoated with a crystalline RAC layer, can be viewed as an article having a composite substrate supporting a crystalline RAC layer or an article having a unitary substrate, a crystalline RAC layer, and an interposed barrier.

Any rare earth alkaline earth copper oxide composition known to be convertible to a crystlline phase can be employed in forming the coated articles of this invention. For example, any of the RAC compositions disclosed in publications P-1 through P-6 can be formed and converted to a crystalline phase by the process of this invention.

Electrically conductive crystalline RAC layers can be formed on a wide variety of substrates. In general any conventional electrical conductor substrate capable of withstanding processing temperatures can be employed. For example, metal, glass, ceramic,f and semiconductor substrates all possess sufficient thermal stability to accept crystalline RAC layers applied by one or more of the procedures described above. Substrates in both polycrystalline and monocrystalline form have been successfully employed.

To achieve articles according to this invention which are not only electrically conductive, but also exhibit high $T_c$ levels, thereby rendering them attractive for high conductivity (e.g., superconducting) electrical applications, it has been observed that some combinations of substrates and rare earth alkaline earth copper oxides are particularly attractive in exhibiting higher $T_c$ levles and higher maximum temperatures at which sucperconductivity is in evidence.

One specifically preferred class of high $T_c$ articles according to this invention are those in which the crystalline RAC layer consists of greater than 45 percent by volume of a rare earth alkaline earth copper oxide which is in a tetragonal $K_2NiF_4$ crystalline phase. The $K_2NiF_4$ crystalline phase preferably consitutes at least 70 percent and optimally at least 90 percent by volume of the RAC layer.

A preferred rare earth alkaline earth copper oxide exhibiting this crystalline phase satisfies the metal ratio:

$$L_{2-x}:M_x:Cu \qquad (I)$$

L is lanthanide,
M is alkaline earth metal, and
x is 0.05 to 0.30.

Among the preferred lanthanides, indicated above, lanthanum has been particularly investigated and found to have desirable properties. Preferred alkaline earth metals are barium and strontium. Optimum results have been observed when x is 0.15 to 0.20.

Thus, in specifically preferred forms of the invention LBC or LSC layers exhibiting a tetragonal $K_2NiF_4$ crystalline phase are present and capable of serving high conductivity applications, including those requiring high $T_c$ levels and those requiring superconductivity at temperatures in excess of 10° K. Specific LBC layers in the tetragonal $K_2NiF_4$ crystalline phase have been observed to have $T_c$ levels in excess of 40° K.

Another specifically preferred class of high $T_c$ articles according to this invention are those in which the crystalline RAC layer consists of greater than 45 percent by volume of a rare earth alkaline earth copper oxide which an $R_1A_2C_3$ cyrstalline phase, believed to be an orthorhombic Pmm2 or orthorhombically distorte dperovskite crystal phase. This phase preferably constitutes at least 70 percent by volume of the RAC flayer.

A preferred rare earth alkaline earth copper oxide exhibiting this crystalline phase satisfies the metal ratio:

$$Y:M_2:Cu_3 \tag{II}$$

M is barium, optionally in combination with one or both of strontium and clacium.

Although the $R_1A_2C_3$ crystalline phase by its crystal lattice requirements permits only a specific ratio of metals to be present, in practice differing ratios of yttrium, rare earth, and copper are permissible. The metal in excess of that required for the $R_1A_2C_3$ crystalline phase in excluded from the phase, but remains in the YAC layer. This is further illustrated in the examples below.

Alkaline earth oxides constitute a preferred clas of substrate materials. They are in general relatively inert, refractory materials which exhibit limited interaction with the RAC layers during their formation. Magnesia in either monocrystalline (i.e., periclase) or polycrystalline form constitutes a particularly preferred substrate material because of its low level of interaction with the RAC layer. Strontium titanate, because it can be readily formed in a perovskite crystalline form, constitutes another preferred alkaline earth oxide substrate material.

Alumina, either in monocrystalline form (i.e., sapphire) or in polycrystalline form constitutes another preferred class of substrate materials. Polycrystalline alumina because of its ready availability and general use as an electrical circuit substrate material is a particularly preferred substrate material. Aluminum nitride is also contemplated as a substrate material.

Semiconductor wafers, particularly monocrystalline silicon and III-V compound wafers, also constitute useful classes of substrates for the articles of this invention.

Another specifically contemplated class of substrate materials are refractory metals. Such metals are, of course, well suited to withstanding RAC layer crystallization temperatures of 1000° C. or more. Refractory metals such as tungsten, tantalum, titanium, and zirconium are particularly contemplated. The refractory metal can form the entire substrate or a thermally resistant layer onto which the RAC layer is coated.

Although some interaction between substrate materials and a contiguous RAC layer is believed to occur when the article is heated to temperatures above about 900° C., interaction effects can be minimized by employing the interposed barrier formation techniques, described above. Further, the laying down of thick films has been found to minimize unwanted substrate interaction effects.

The ligands present in the metal-ligand compounds described above form no part of the final article and therefore can be chosen based solely upon convenience in performing the process steps described above. Ligands are chosen first of all for their ability to form solutions in which rare earth, alkaline earth, and copper combined with the ligands are each soluble in the desired proportions. Second, the ligands are chosen to be volatilizable during heating to form the intermediate RAC layer.

By "volatilizable" it is meant that the ligand or its component elements other than oxygen can be removed from the substrate surface at temperatures below the crystallization temperature of the RAC layer.

Inorganic ligands, such as nitrate, sulfate, and halide ligands, are illustrative of preferred ligands satisfying the criteria set forth above. Nitrate, bromide, and chloride ligands are particularly preferred. In general the ligands are chosen so that each of the rare earth, alkaline earth, and copper ligand compounds exhibit approximately similar solubility characteristics.

Any evaporative solvent for the metal-ligand compounds can be employed for particle fabrication. Again, the solvent forms no part of the final article. Pplar solvents, such as water or alcohols (e.g., methanol, ethanol, propanol, etc.), are particularly suited for use with metal-ligand compounds containing the inorganic ligands noted above.

Where a paste is coated, the paste contains either a small residual portion of the original solvent for the metal-ligand compounds or a different liquid to promote cohesion. The liquid fraction of the past must be volatilizable. The evaporative solvents noted above all satisfy this criteria.

The past apart from the metal-ligand particles can be identical in composition to conventional inks employed in screen printing. Screen printing inks normally contain an active ingredient (in this instance supplied by the metal-ligand particles), binders to promote substrate adhesion (such as glass frit or crystalline oxide powder), screening agents used to enhance the rheological properties of the ink—usually a higher molecular weight polymr, such as poly(vinyl alcohol) or poly(ethylene glycol), and a liquid, most commonly water or an alcohol. It is a particular advantage of this invention that the metal-ligand particles and liquid together provide excellent rheological and adhesion properties without the necessity of incorporating other screen printing ink ingredients.

Processing temperatures employed in forming the intermediate RAC layers and in subsequently converting the intermediate layers to electrically conductive crystalline layers can vary significantly, depending upon the specific RAC composition and crystal form under consideration. Crystallization is in all instances achieved below the melting point of the RAC composition. Melting points for RAC compositions vary, but are typically well above 1000° C. Typically the electrically conductive crystalline RAC layers are formed by heating to temperatures in the range of from about 900° to 1100° C.

The metal-ligand compounds can be in crystalline form. Since the metal-ligand compounds are confined to separate particles at the time precipitation from solution occurs, undesirable phase separation of the differing metal components is effectively confined within the individual particle boundaries. Thus, simple inorganic ligands that favor deposition of the metal-ligand compounds in cyrstalline form are entirely compatible with the practice of this invention.

A preferred technique for producing a high $T_c$ coating employing an intermediate layer of the LAC composition metal ratio I above, particularly an LBC or LSC composition, is to heat the intermediate layer on the substrate to a temperature of about 925° to 975° C. and then increase the temperature to about 975° to 1050° C. Following conversion of the LAC layer to the tetragonal $K_2NiF_4$ crystalline phase, it is cooled slowly at rate of 25° C. or less per minute until it reaches a temperature of 550° to 450° C. The LAC layer is then held at this temperature or reheated to this temperature in the presence of an oxygen atmosphere until oxygen equilibration is substantially complete, typically about 20 to 120 minutes.

A preferred technique for producing a high $T_c$ coating employing an intermediate layer of the YAC composition satisying metal ratio II above, particularly YBC, is to heat the intermediate layer on the substrate to a temperature greater than 900° C., but less than 950° C., optimally 920° to 930° C. Following conversion of the intermediate layer to the $R_1A_2C_3$ crystalline phase, it is cooled slowly at rate of 25° C. or fless per minute until it reaches a temperature of 750° to 400° C. The YAC layer is then held at this temperature or reheated to this temperature following cooling in the presence of an oxygen atmosphere until oxygen equilibration is substantially complete, typically about 20 to 120 minutes.

Thick films produced by the present invention can vary widely in their thicknesses. Final thicknesses are contemplated in the range of from about 5 to 200 μm, with thicknesses of about 10 to 100 μm being preferred for most thick film application. With care to avoid thermal stresses still greater coating thicknesses should be possible. As previously noted thin films can be readily fabricated by the process of this invention.

EXAMPLES

Details of the preparation and performance of articles according to this invention are illustrated by the following examples.

EXAMPLE 1

This example illustrates the formation of a conductive thick film coating of $Y_1B_2C_3$ on sapphire.

PFS-1

A particle-forming solution was prepared by mixing the following ingredients in the proportions indicated, corresponding to the cation ratio in $Y_1B_2C_3$:

Y(NO$_3$)$_3$6H$_2$O: 13.41 g
Ba(NO$_3$)$_2$: 18.30 g
Cu(NO$_3$)$_2$2.5H$_2$O: 24.42 g
H$_2$O: 500.00 ml.

The water employed was distilled wat er. The solution was filtered through a 0.45 μm membrane filter.

PFD-1 was converted to a mixed powder and paste by spray drying. A Yamato ® Model GA-31 spray drier was employed in its normal mode of operation.

Inlet Temp.: 200° C.
Outlet Temp.: 80° C.
Aspirator Setting: 2.5
Pump Setting: 2.5
Drying Air: 0.3–0.35 m$^3$/min.
Atomizing Air: 0.53 MPa
Pulsed Air Interval: 10 sec.

A #2050SS liquid nozzle and a #64-5SS air nozzle were used. The spraying rate was about 10 ml/min.

The material obtained from the spray drier was a mixture of a dry powder (pale bule) and a partially hydrated powder which was a thick paste (sky blue). Addition of approximately 10% by weight water transformed the dry powder into a paste. Chemical analysis indicated the cation ratio to be identical to that of the starting solution.

The paste was spread onto a monocrystalline alumina (sapphire) 1102 crystal surface. Paste coating thicknesses were in the 10 to 20 μm range.

The paste was heated to 925° C. on the substrate in air in a furnace and held at that temperature for 5 minutes. At the end of 5 minutes the coated article was allowed to cool at the rate of <25° C. per minute.

The resulting YBC crystalline layer was about 14 μm in thickness and adhered well to the substrate. Sheet resistance of the YBC crystalline layer was determined to be in the order of 20 to 40 ohms per square at room temperature. X-ray analysis confirmed that the YBC crystalline layer exhibited a $Y_1B_2C_3$ phase.

EXAMPLE 2

This example illustrates the formation of a high transition temperature superconductive thick film coating of $Y_1B_2C_3$ on monocrystalline MgO.

PFS-2

A particle-forming solution ws prepared by mixing the following ingredients in the proportions indicated:

YNNO$_3$)$_3$6H$_2$O: 28.15 g
Ba(NO$_3$)$_2$: 36.6 g
Cu(NO$_3$)$_2$2.5H$_2$O:51.29 g
H$_2$O: 750 ml.

The water employed was distilled water. The solution was filtered through a 0.45 μm membrane filter. To compensate for possible loss of the yttrium and copper salts a 5% molar excess of each was employed above the desired $Y_1B_2C_3$ stoichiometric molar ratio. Subsequent investigations have shown that no significant loss of either yttrium or copper salts occurs. Therefore, a stoichiometric excess of these salts as been shown not to be necessary but nonetheless useful.

PFS-2 was converted to a dry powder by spray drying, using the same spray drier and nozzles as in Example 1.

Inlet Temp.: 200° C.
Outlet Temp.: 100°–105° C.
Aspirator Setting: 3
Pump Setting: 4
Drying Air: 0.3–35 m$^3$/min.
Atomizing Air: 0.30 MPa
Pulsed Air Interval: 20 set.

The same nozzles and spraying rate were employed as in Example 1.

The powder obtained from the spray driver very dry and was stored briefly in a vacuum oven before use.

A small amount of the powder was mixed with water in the amount of 1 to 2 drops of water per gram of powder to form a paste. The paste was then hand coated on a monocrystalline MgO substrate to a thickness of approximately 50 μm.

The coated substrate was placed on a hot plate at room temperature and heated rapidly to 535° C., at which time it was covered with aluminum foil. Heating was continued for approximately 30 minutes, at the end of which time the temperature of the coating was in the range of from 590° to 650° C. The sample was allowed to cool under the aluminum foil until it reaced about 250° C. and was then taken off the hot plate. It was then cooled further to room temperature at a relatively rapid rate.

The sample was next heated to 925° C. in air in a furnace and held at that temperat ure for 15 minutes. At the end of 15 minutes the sample was allowed to cool to room temperature at the rate of less than 10° C. per minute.

The resulting YBC crystalline thick film adhered well to the substrate. X-ray analysis indicated the orthorhombic $Y_1B_2C_3$ phase, with a small amount of other phases being present. The secondary phases appeared as green blotches on the surface of the balck sample. There were some cracks in the coating.

The amples was then oxygen annealed by being held at 650° C. for 30 minutes in an oxygen atmosphere and then cooled in the oxygen atmosphere to about 290° C. over a period of 32 minutes.

The sheet resistance of the sample at room temperature before and after oxygen annealing was 3 ohms per square, measured with a four point probe.

The sample was cooled with its resistance being concurrently measured. The resistance remained constant until the region of 95° to 100° K. was reached. At 77° K.±2° K. the sample was entirely superconducting. Remeasurement determined $T_c$ to be 97° K.±2° K. with superconductivity occurring at m76° K.±2° K.

EXAMPLE 3 this example illustrates screen printing of patterned coatings.

PFS-3

A particle-forming solutin was prepared by mixing the following ingredients in the proportions indicated:
$Y(NO_3)_3 6H_2O$: 26.81
$Ba(NO_3)_2$: 36.59 g
$Cu(NO_3)_2 2.5H_2O$: 48.85 g
$H_2O$: 690 ml.

Preparation was similar PFS-2, except that no stoichiometric excess of metal salts was included.

PFS-3 was converted to a wet powder by spray drying, using the same spray drier and nozzles as in Example 1.
Inlet Temp.: 180°–200° C.
Outlet Temp.: 74°–85° C.
Aspirator Setting: 3 (approx.)
Pump Setting: 1.5
Drying Air: 0.3–0.35 m³/min.
Atomizing Air: 0.30–0.34 MPa
Pulsed Air Interval: 20 sec.

The same nozzles and spraying rate were employed as in Example 1.

The wet powder obtained was placed in a drying oven at 110° C. for several dyas. It was removed and ground using a mortar and pestle. The powder was tnen converted to a paste by adding approximately 13% by weight water dropwise until a thick consistency was obtained. A portion of the paste was then further diluted to approximately 14% by weight water to give a thinner consistency paste. The two pastes are identified as the diluted and non-diluted pastes.

One sample of the diluted paste was coated onto a polycrystalline alumina insulative support having a gold contact pattern on its surface. The diluted paste was coated so that it overlapped both areas containing the gold contact patterna and defined areas between spaced gold contact areas. The diluted paste was screen printed in a series of parallel rectangular patterns of varied size using a 200 mesh screen.

After a 15 to 20 minute delay the sample coated as described above was heated on a hot plate as described in Example 2. The sample was heated in air in a furnace at 850° C. for 15 minutes and then cooled at a rate of less than 25° C. per minute to room temperature.

Some cracking of the coating was observed, however resistance probes to spaced gold contact areas joined by the coating temonstrated that the coating provided an electrical conduction path. The final coating was about 24 μm in thickness.

Several more samples processed as described above through the hot plate stage where furnace heated and cooled under varied conditions. Both the diluted and non-diluted paste appeared capable of producing desirable coatings. Higher furnace tempeatures and more abrupt changes in temperatures increased the number of cracks observed, but in each instance patterned electrical conductors were obtained. In every instance the gold contact pattern produced satisfactory conductive contact with the YBC layer.

EXAMPLE 4

This example illustrates coating on polycrystalline alumina and strontium titanate substrates.

A powder was made from a solution similar to PFS-1, except it was 50 ml more concentrated by using the spray drying conditions of Example 2. Using procedures similar to those described in Example 2 coatings were prepared on alumina and strontium titanate supports. The coating thickness after hot plate treatment of the alumina substrate article was 40 to 70 μm. The coating thickness on one portion of the strontium titanate article was 90 to 100 μm and 40 to 60 μm on a second portion.

the samples were heated in air in a furnace at 925° C. for 5 minutes, cooled to room temperature at a rate of less than 25° C. per minute, heated at the rate of 25° to 50° C. per minute to 925° C., held at that temperature for 20 minutes, and then cooled back to room temperature at same rate indicated above. The final coating thicknesses were found to be about half the thickness noted above.

After annealing the samples at 925° C. in oxygen, the strontium titanate sample exhibited a sheet resistance of 5 ohms per square while the alumina sample exhibited a sheet resitance of 50 ohms per square at toom temperature.

EXAMPLE 5

This example illustrates forming conduction paths through apertures in a substrate.

A polycrystalline alumina substrate was employed having a thicknes of about 1 mm containing five apertures of 0.5 mm in diameter spaced about 1 mm apart.

A coating was prepared on one surface of the substrate by the same procedure described in Example 2 througha the step of cooling to room temperature following hot plate heating, except that PFS-4 was substituted for PFS-2 and the spray drier was operated under the conditions indicated below:

PFS-4
$Y(NO_3)_3 6H_2O$: 40.22 g
$Ba(NO_3)_2$: 54.55 g
$Cu(NO_3)_2 2.5H_2O$: 73.27 g
$H_2O$: 1400.00 ml.
Inlet Temp.: 200° C.
Outlet Temp.: 90°–95° C.
Aspirator Setting: 3.1
Pump Setting: 1.7
Drying Air: 0.3–0.35 m³/min.
Atomizing Air: 0.1 MPa
Pulsed Air Interval: 20 sec.

The past produced contained 9.3% by weight water.

The opposite major surface of the substrate was then similarly coated and processed, except that the substrate was not placed directly on the hot plate, but was sat on spaced pieces of 1 mm polycrystalline alumina with the first coating being closest located nearest to the hot plate surface.

Following hot plate cooling the article with coatings on opposite major surfaces was placed in a furnace again using the spaced pieces of polycrystalline alumina and further processed as described in Example 2. The first YBC film was 10 μm in thickness while the second YBC film was 30 μm in thickness.

By applying electrical probes to the first and second surfaces it was determined that electrical conduction paths through the apertures had been established. No current conduction occurred when either or both probes were placed on uncoated substrate surfaces adjacent to the YBC film.

This invention has been described in detail with particular reference to preferred embodiments thereof, but it will be understood that variations and modifications can be effected within the spirit and scope of the invention.

What is claimed is:

1. A circuit element comprising
   an insulative substrate and
   means for providing a conductive path between at least two locations on the substrate including a thick film conductor, the thick film conductor being comprised of a crystalline rare earth alkaline earth copper oxide layer having a thickness of at least 5 μm,
   characterized in that
   said substrate is strontium titanate and
   said crystalline rare earth alkaline earth coppper oxide layer exhibits a superconducting onset transition temperature in excess of 77° K. and is comprised of a $R_1A_2C_3$ crystalline phase.

2. A circuit element comprising
   an insulative substrate and
   means for providing a conductive path between at least two locations on the substrate including a thick film conductor, the thick film conductor being comprised of a crystalline rare earth alkaline earth copper oxide layer having a thickness of at least 5 μm,
   characterized in that
   said substrate is magnesia and
   said crystalline rare earth alkaline earth copper oxide layer exhibits a superconducting onset transition temperature in excess of 77° K. and is comprised of a $R_1A_2C_3$ crystalline phase.

3. A circuit element comprising
   an insulative substrate and
   means for providing a conductive path between at least two locations on the substrate including a thick film conductor, the thick film conductor being comprised of a crystalline rare earth alkaline earth copper oxide layer having a thickness of at least 5 μm,
   characterized in that
   said substrate is alumina and
   said crystalline rare earth alkaline earth copper oxide layer exhibits a superconducting onset transition temperature in excess of 77° K. and is comprised of a $R_1A_2C_3$ crystalline phase.

4. A circuit element comprising
   an insulative substrate and
   means for providing a conductive path between at least two locations on the substrate including a thick film conductor, the thick film conductor being comprised of a crystalline rare earth alkaline earth copper oxide layer having a thickness of at least 5 μm,
   characterized in that
   said substrate is aluminum nitride and
   said crystalline rare earth alkaline earth copper oxide layer exhibits a superconducting onset transition temperature in excess of 77° K. and is comprised of a $R_1A_2C_3$ crystalline phase.

5. A circuit element according to any one of claims 1, 2, 3, and 4 further characterized in that the thick film is comprised of a crystalline rare earth alkaline earth copper oxide layer having a thickness in the range of from 5 μm to 200 μm.

6. A circuit element according to any one of claims 1, 2, 3, and 4 further characterized in that the thick film is at least 10 μm in thickness.

7. A circuit element according to any one of claims 1, 2, 3, and 4 further characterized in that the thick film is comprised of a crystalline rare earth alkaline earth copper oxide layer having a thickness in the range of from 10 μm to 100 μm.

8. A circuit element according to any one of claims 1, 2, 3, and 4 further characterized in that the thick film conductor is restricted to a portion of the substrate.

9. A circuit element according to any one of claims 1, 2, 3, and 4 further characterized in that the rare earth alkaline earth copper oxide consists of yttrium as the rare earth and barium, optionally in combination with at least one of strontium and calcium, as the alkaline earth.

10. A circuit element according to any one of claims 1, 2, 3, and 4 further characterized in that the conductive path means includes at least one semiconductor device.

11. A circuit element according to any one of claims 1, 2, 3, and 4 further characterized in that the conductive path means includes at least one capacitor.

12. A circuit element according to any one of claims 1, 2, 3, and 4 further characterized in that the conductive path means includes at least one resistor.

13. A circuit element according to any one of claims 1, 2, 3, and 4 further characterized in that the crystalline rare earth alkaline earth copper oxide forms a sinuous serpentine or spiral path electrical conduction path.

14. A circuit element according to any one of claims 1, 2, 3, and 4 further characterized in that the conductive path means includes at least one electrically conductive device presenting a metallic lead and means conductively bonding the metallic lead to the crystalline rare earth alkaline earth copper oxide.

15. A circuit element comprising
    an insulative substrate presenting first and second parallel major surfaces and
    a first means for providing a conductive path between at least two locations on the first major surface including a first thick film conductor,
    a second means for providing a conductive path between at least two locations on the second major surface incoluding a second thick film conductor,
    said first and second thick film conductors each having a thickness of at least 5 μm,
    characterized in that
    the first and second thick film conductors are each comprised of a crystalline rare earth alkaline earth copper oxide exhibits a superconducting onset transition temperature in excess of 77° K. and is comprised of a $R_1A_2C_3$ crystalline phase and the substrate is chosen from the class consisting of strontium titanate, magnesia, alumina, and aluminum nitride.

16. A circuit element comprising an insulative substrate presenting first and second parallel major surfaces, a first means for providing a conductive path between at least two locations on the first major surface including a thick film conductor having a thickness of at least 5 μm, a second means for providing a conductive path between at least two locations on the second major surface including a thick film conductor, and a third means for providing a conductive path between the first and second conductive path means, characterized in that the first means is comprised of a crystalline rare earth alkaline earth copper oxide which exhibits a superconducting onset transition temperature in excess of 77° K. and is comprised of a $R_1A_2C_3$ crystalline phase and the substrate is chosen from the class consisting of strontium titanate, magnesia, alumina, and aluminum nitride.

* * * * *